United States Patent
Li et al.

(10) Patent No.: US 12,538,559 B2
(45) Date of Patent: Jan. 27, 2026

(54) SEMICONDUCTOR PACKAGES AND METHODS OF FORMING

(71) Applicant: Taiwan Semiconductor Manufacturing Co., Ltd., Hsinchu (TW)

(72) Inventors: Cheng-Chieh Li, Hsinchu (TW); Chih-Wei Wu, Zhuangwei Township (TW); Ying-Ching Shih, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 628 days.

(21) Appl. No.: 17/830,904

(22) Filed: Jun. 2, 2022

(65) Prior Publication Data
US 2023/0395431 A1    Dec. 7, 2023

(51) Int. Cl.
*H10D 84/03* (2025.01)
*H01L 21/48* (2006.01)
(Continued)

(52) U.S. Cl.
CPC ....... *H10D 84/038* (2025.01); *H01L 21/4857* (2013.01); *H01L 21/486* (2013.01);
(Continued)

(58) Field of Classification Search
CPC . H01L 21/822; H01L 21/4857; H01L 21/486; H01L 21/565; H01L 23/3121; H01L 23/49822; H01L 23/49838; H01L 24/73; H01L 23/3135; H01L 23/49827; H01L 24/20; H01L 21/568; H01L 23/147; H01L 23/5389; H01L 2221/68359;
(Continued)

(56) References Cited

U.S. PATENT DOCUMENTS 8,993,380 B2    3/2015    Hou et al.
9,281,254 B2    3/2016    Yu et al.
(Continued)

FOREIGN PATENT DOCUMENTS

JP    2014007235 A  *  1/2014
TW    202044507 A     12/2020
TW    202125709 A     7/2021

*Primary Examiner* — Ratisha Mehta
*Assistant Examiner* — Sophia W Kao
(74) *Attorney, Agent, or Firm* — Slater Matsil, LLP

(57) ABSTRACT

A method of forming a semiconductor structure includes: forming a first redistribution structure on a first side of a wafer, the first redistribution structure including dielectric layers and conductive features in the dielectric layers; forming grooves in the first redistribution structure, the grooves exposing sidewalls of the dielectric layers and the wafer, the grooves defining a plurality of die attaching regions; bonding a plurality of dies to the first redistribution structure in the plurality of die attaching regions; forming a first molding material on the first side of the wafer around the plurality of dies, the first molding material filling the grooves; forming a passivation layer on a second side of the wafer opposing the first side; and dicing along the grooves from the second side of the wafer to form a plurality of individual semiconductor packages, each of the plurality of individual semiconductor packages including a respective die.

20 Claims, 14 Drawing Sheets

(51) Int. Cl.
*H01L 21/56* (2006.01)
*H01L 23/00* (2006.01)
*H01L 23/31* (2006.01)
*H01L 23/498* (2006.01)

(52) U.S. Cl.
CPC ........ *H01L 21/565* (2013.01); *H01L 23/3121* (2013.01); *H01L 23/49822* (2013.01); *H01L 23/49838* (2013.01); *H01L 24/16* (2013.01); *H01L 24/32* (2013.01); *H01L 24/73* (2013.01); *H01L 2224/16227* (2013.01); *H01L 2224/16238* (2013.01); *H01L 2224/32225* (2013.01); *H01L 2224/73204* (2013.01)

(58) Field of Classification Search
CPC ............... H01L 2224/81; H01L 21/561; H01L 21/6835; H01L 23/3128; H01L 24/19
See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,121,052 B2 | 9/2021 | Lai et al. |
| 11,404,316 B2 | 8/2022 | Yu et al. |
| 2008/0029847 A1* | 2/2008 | Guillermo ........... H01L 21/6836 |
| | | 257/E29.022 |
| 2017/0263544 A1* | 9/2017 | Hiner ..................... H01L 24/97 |
| 2019/0006314 A1* | 1/2019 | Jeng ..................... H01L 21/4853 |
| 2021/0074600 A1 | 3/2021 | Jeng et al. |
| 2021/0202436 A1* | 7/2021 | Yeh ..................... H01L 21/6836 |
| 2021/0217692 A1 | 7/2021 | Kelly et al. |
| 2022/0384388 A1* | 12/2022 | Chen ..................... H01L 23/544 |

\* cited by examiner

SEMICONDUCTOR PACKAGES AND METHODS OF FORMING

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As the demand for shrinking electronic devices has grown, a need for smaller and more creative packaging techniques of semiconductor dies has emerged. An example of such packaging techniques is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure, where a semiconductor chip is attached to a wafer (e.g., an interposer) to form a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
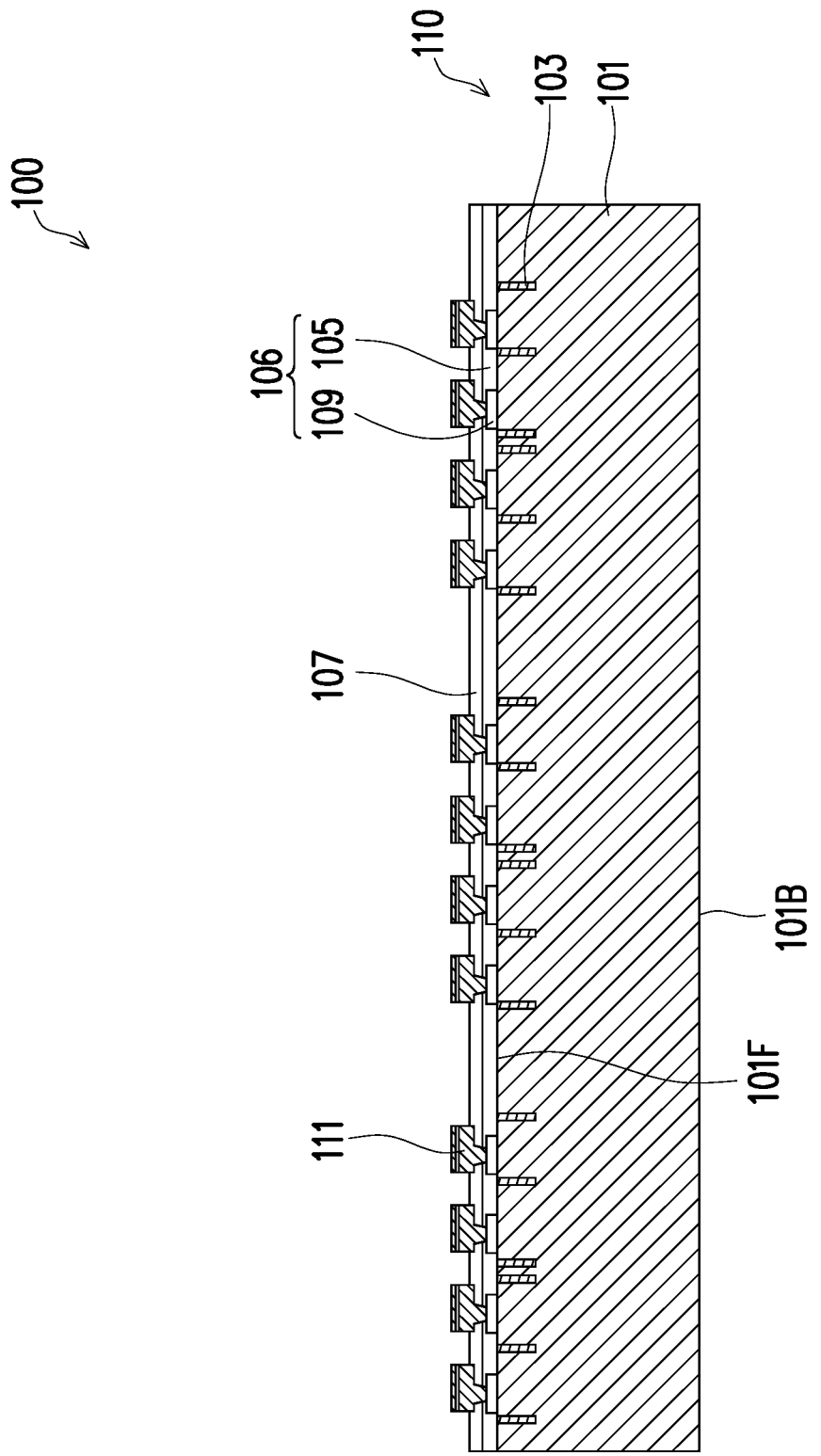
FIGS. 1, 2A, 2B, and 3-6 illustrate various views of a semiconductor structure at various stages of fabrication, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar component formed by a same or similar formation method using a same or similar material(s).

In some embodiments, grooves are formed in the redistribution structure on a wafer along dicing regions of the wafer using a laser tool. The grooves extend through the dielectric layers of the redistribution structure to expose the wafer. Next, dies are attached to die attaching regions of the wafer, and a molding material is formed on the wafer around the dies. The molding material fills the grooves. Next, a dicing process is performed using a blade to separate the CoW packages formed on the wafer. The grooves formed in the redistribution structure allows the dicing process to be performed without the blade contacting the dielectric layers of the redistribution structure, thereby avoiding cracking of the dielectric layers during the dicing process. The grooves may further reduce stress exerted on the dielectric layers in the CoW package formed.

FIGS. 1, 2A, 2B, and 3-6 illustrate various views (e.g., cross-sectional view, top view) of a semiconductor structure 100 at various stages of fabrication, in accordance with an embodiment. In the process flow illustrated by FIGS. 1, 2A, 2B, and 3-6, a Chip-On-Wafer (CoW) structure is formed. Note that for simplicity, some of FIGS. 1, 2A, 2B, and 3-6 may illustrate only a portion of the semiconductor structure 100 (e.g., a portion comprising one CoW package), with the understanding that multiple CoW packages may be simultaneously formed (e.g., formed in the same processing steps) on a wafer, and may be singulated (e.g., diced) to form multiple individual CoW packages.

FIG. 1 illustrates a cross-sectional view of an interposer 110, which includes a substrate 101 (may also be referred to as a wafer 101), a redistribution structure 106 over the substrate 101, and external connectors 111 (may also be referred to as conductive pads 111) over and electrically coupled to the redistribution structure 106.

The substrate 101 may be, e.g., a silicon substrate, doped or undoped, or an active layer of a silicon-on-insulator (SOI) substrate. However, the substrate 101 may alternatively be a glass substrate, a ceramic substrate, a polymer substrate, or any other substrate that may provide a suitable protection and/or interconnection functionality. In an example embodiment, the substrate 101 is a round silicon wafer with a diameter of, e.g., about 300 mm.

In some embodiments, the substrate 101 may include electrical components, such as resistors, capacitors, signal distribution circuitry, combinations of these, or the like. These electrical components may be active, passive, or a combination thereof. In other embodiments, the substrate 101 is free from both active and passive electrical components therein. All such combinations are fully intended to be included within the scope of this disclosure.

In the example of FIG. 1, through vias 103 extend from a front side 101F of the substrate 101 toward a backside 101B of the substrate 101. The through via 103 extend into the substrate 101 from the front side 101F, but does not extend through the substrate 101. In subsequent processing, the substrate 101 is thinned and the through vias 103 extend through the (thinned) substrate 101 to provide electrical connection between the front side 101F and the backside loth of the substrate 101. The through vias 103 may be formed of a suitable conductive material such as copper, tungsten, aluminum, alloys, doped polysilicon, combinations thereof, and the like. A barrier layer may be formed between the through vias 103 and the substrate 101. The barrier layer may comprise a suitable material such as titanium nitride, although other materials, such as tantalum nitride, titanium, or the like, may alternatively be utilized.

The redistribution structure 106 is formed over the front side 101F of the substrate 101. The redistribution structure 106 includes one or more dielectric layers 105 and conductive features 109 (e.g., conductive lines and vias) formed in the one or more dielectric layers 105. The number of dielectric layers 105 and the conductive features 109 shown in FIG. 1 is a non-limiting example. Other numbers of dielectric layers 105 and conductive features 109 are also possible and are fully intended to be included within the scope of the present disclosure.

In some embodiments, the dielectric layer 105 of the redistribution structure 106 is formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers 105 may be formed by any suitable deposition process, such as spin coating, chemical vapor deposition (CVD), laminating, the like, or a combination thereof.

In some embodiments, the conductive features 109 of the redistribution structure 106 comprise conductive lines and/or conductive via formed of a suitable conductive material such as copper, titanium, tungsten, aluminum, or the like. The conductive features may be formed by, e.g., forming openings in the dielectric layer 105 to expose underlying conductive features, forming a seed layer over the dielectric layer 105 and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed.

Still referring to FIG. 1, a dielectric layer 107 is formed over the redistribution structure 106. External connectors 111 are formed to extend through the dielectric layer 107 and electrically coupled to conductive features 109 of the redistribution structure 106. The dielectric layer 107 may be formed of a same or similar material as the dielectric layer 105 using a same or similar formation method, thus details are not repeated. Example materials for the dielectric layers 105 and 107 include silicon oxide with porous structure, such as undoped silicon glass (USG) or fluorosilicate glass (FSG). In some embodiments, the dielectric layer 107 is considered a top layer of the redistribution structure 106, and therefore, the external connectors 111 are considered as being formed on the redistribution structure 106.

The external connectors 111 are formed over and electrically coupled to conductive features of the redistribution structure 106. The external connectors 111 may be any suitable type of external contacts, such as micro-bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like.

Figure 2A:
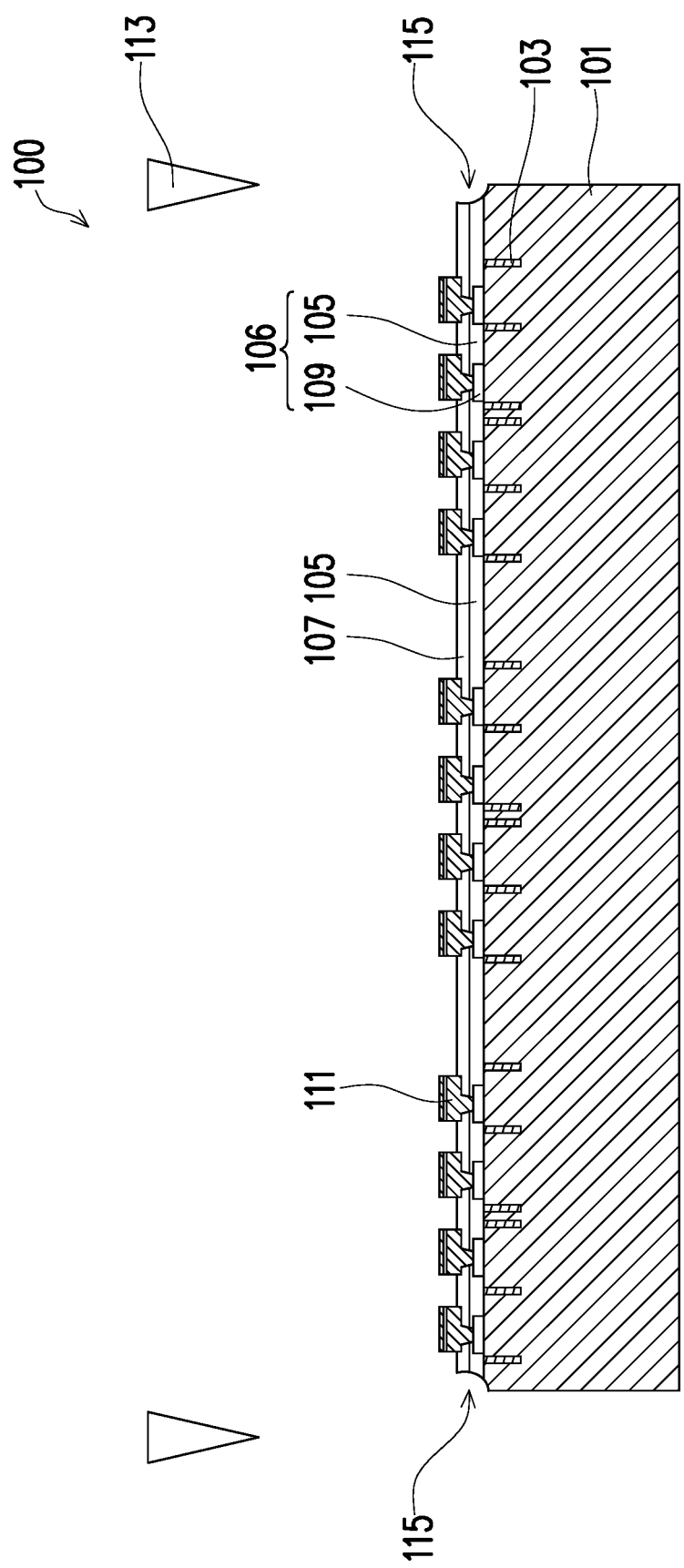

Next, in FIG. 2A, grooves 115 are formed in the redistribution structure 106 along dicing regions of the wafer 101. The grooves 115 (also referred to as notches 115) are formed to extend through the redistribution structure 106 and expose the underlying wafer 101. In an example embodiment, the grooves 115 are formed using a laser tool 113. During the laser etching process, the laser beam of the laser tool 113 ablates portions of the redistribution structurer 106 that are disposed along dicing regions of the wafer 101 to form the grooves 115. In some embodiments, one laser tool 113 may move along the dicing regions of the wafer 101 in multiple passes to form the grooves 115. In some embodiments, multiple laser tools 113 may move along the dicing regions in parallel to form the grooves 115 in a shorter period of time.

In the example of FIG. 2A, the grooves 115 expose sidewalls of the dielectric layers 105/107, and the wafer 101 is exposed at the bottoms of the grooves 115. In some embodiments, the laser etching process also removes upper portions of the wafer 101, and therefore, the grooves 115 extends into the wafer 101. As a result of laser etching, the sidewalls of the grooves 115 may be curved, and the bottoms of the grooves 115 may also be curved, as illustrated in FIG. 2A.

Forming the grooves 115 using laser tool prevents cracking of the dielectric layers 105 and 107 during formation of the grooves 115. In some embodiments, the dielectric layers 105 and 107 formed on the wafer 101 are brittle, and may crack under stress if a blade is used to cut through the dielectric layers 105/107 to form the grooves 115. Using the laser tool 113 avoids the stress caused by the blade cutting through the dielectric layers 105/107, thereby avoiding cracking of the dielectric layers 105/107.

Figure 2B:
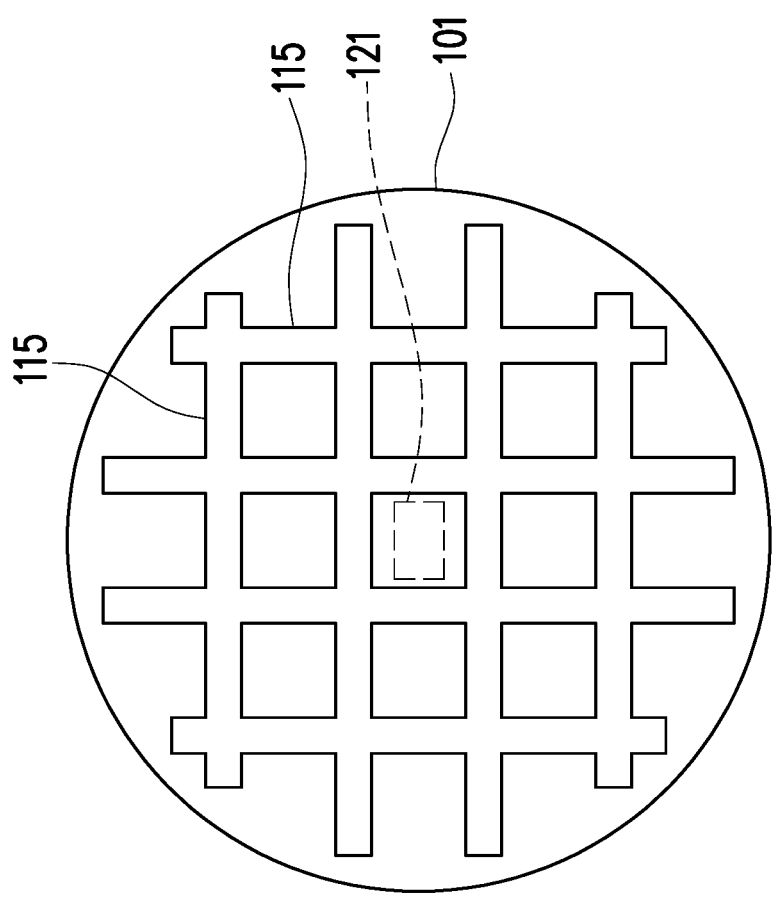

FIG. 2B illustrates a top view of the structure shown in FIG. 2A. For simplicity, not all features of FIG. 2A are illustrated in FIG. 2B. FIG. 2B shows the wafer 101, and the grooves 115 extending along the dicing regions of the wafer 101. In other words, the grooves 115 overlap with the dicing regions of the wafer 101. The grooves 115 define a plurality of die attaching regions (e.g., the rectangular regions defined by horizontal grooves 115 and vertical grooves 115 that are intersecting with each other). FIG. 2B further illustrates a die 121 (shown in phantom) attached to one of the die attaching regions. The die 121 in FIG. 2B may correspond to the die 121 in FIG. 3.

Figure 3:
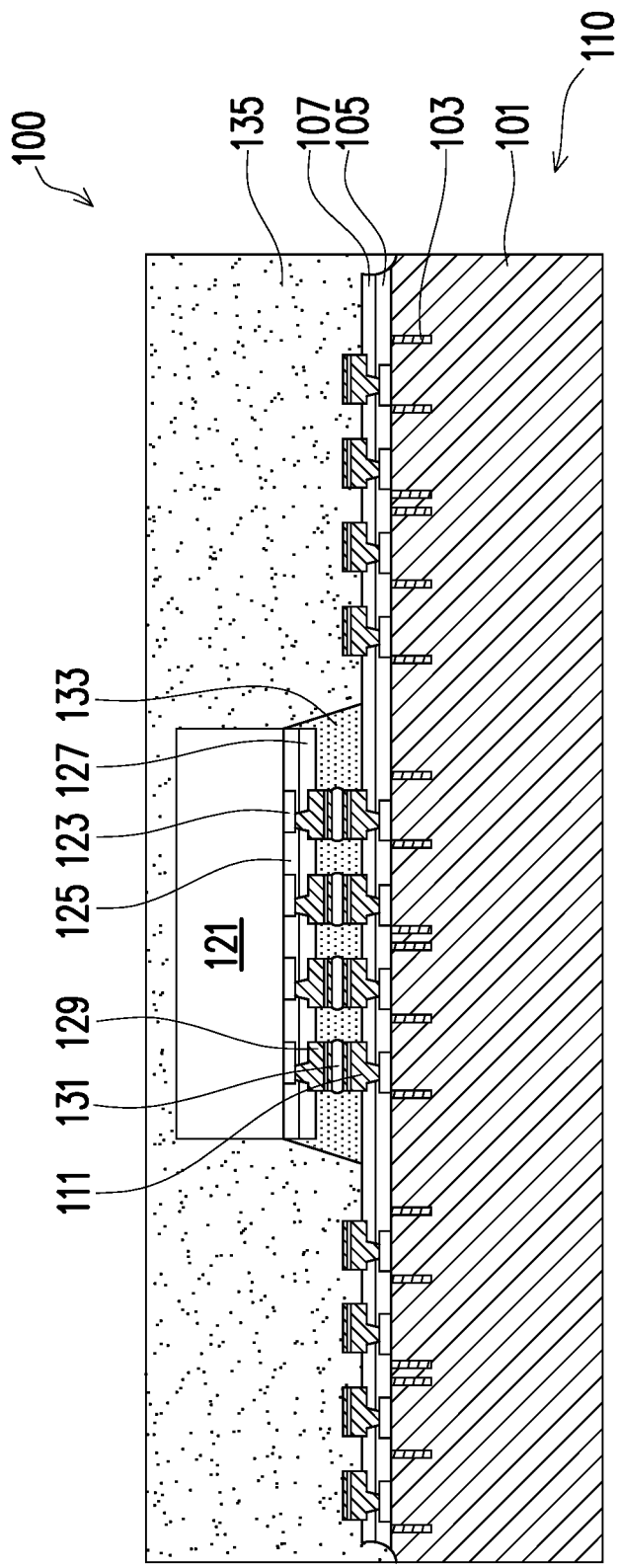

Next, in FIG. 3, a die 121 is bonded to the external connectors in of the interposer 110. The die 121 includes a substrate, electrical components (e.g., transistors, resistors, capacitors, diodes, or the like) formed in/on the substrate, and an interconnect structure over the substrate connecting the electrical components to form functional circuits of the die 121. The die 121 also includes die connectors 129 that provide electrical connection to the functional circuits of the die 121.

The substrate of the die 121 may be a semiconductor substrate, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The electrical components of the die 121 comprise a wide variety of active devices (e.g., transistors) and passive devices (e.g., capacitors, resistors, inductors), and the like. The electrical components of the die 121 may be formed using any suitable methods either within or on the substrate of the die 121. The interconnect structure of the die 121 comprises one or more metallization layers (e.g., copper layers) formed in one or more dielectric layers, and is used to connect the various electrical components to form the functional circuits of the die 121.

One or more passivation layers (not shown) may be formed over the interconnect structure of the die 121 in order to provide a degree of protection for the underlying structures of the die 121. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Contact pads 123 are formed over the passivation layer and extend through the passivation layer to be in electrical contact with the interconnect structure of the die 121. The contact pads 123 may comprise aluminum, but other materials, such as copper, may alternatively be used.

Die connectors 129 of the die 121 are formed on the contact pads 123 to provide conductive regions for electrical connection to the circuits of the die 121. The die connectors 129 may be copper pillars, contact bumps such as microbumps, or the like, and may comprise a material such as copper, tin, silver, or other suitable material. FIG. 3 further illustrates dielectric layers 125 and 127 around the contact pads 123 and the die connectors 129. Each of the dielectric layers 125 and 127 may be formed of a suitable dielectric material (e.g., a polymer layer) using any suitable formation method.

In some embodiments, a reflow process is performed to bond the die connectors 129 with corresponding external connectors 111 through solder regions 131. After the die 121 is bonded to the interposer 110, an underfill material 133 is formed between the die 121 and the interposer 110. The underfill material 133 may, for example, comprise a liquid epoxy that is dispensed in a gap between the dies 121 and the interposer 110, e.g., using a dispensing needle or other suitable dispensing tool, and then cured to harden. As illustrated in FIG. 3, the underfill material 133 fills the gap between the die 121 and the interposer 110, and may also extend along lower sidewalls of the dies 121. In other embodiments, the underfill material 133 is omitted.

Next, a molding material 135 is formed on the interposer no around the die 121. The molding material 135 also surrounds the underfill material 133 in embodiments where the underfill material 133 is formed. Notably, the molding material 135 fills the grooves 115, and therefore, covers (e.g., physically contacts and extends along) sidewall of the dielectric layers 105/107.

The molding material 135 may comprise an epoxy, an organic polymer, a polymer with or without a silica-based filler or glass filler added, or other materials, as examples. In some embodiments, the molding material 135 comprises a liquid molding compound (LMC) that is a gel type liquid when applied. The molding material 135 may also comprise a liquid or solid when applied. Alternatively, the molding material 135 may comprise other insulating and/or encapsulating materials. The molding material 135 is applied using a wafer level molding process in some embodiments.

The molding material 135 may be molded using, for example, compressive molding, transfer molding, molded underfill (MUF), or other methods.

Next, the molding material 135 is cured using a curing process, in some embodiments. The curing process may comprise heating the molding material 135 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 135 may be cured using other methods. In some embodiments, a curing process is not included. After the molding material 135 is formed, a planarization process, such as chemical and mechanical planarization (CMP), may be performed to achieve a level upper surface for the molding material 135.

Figure 4:
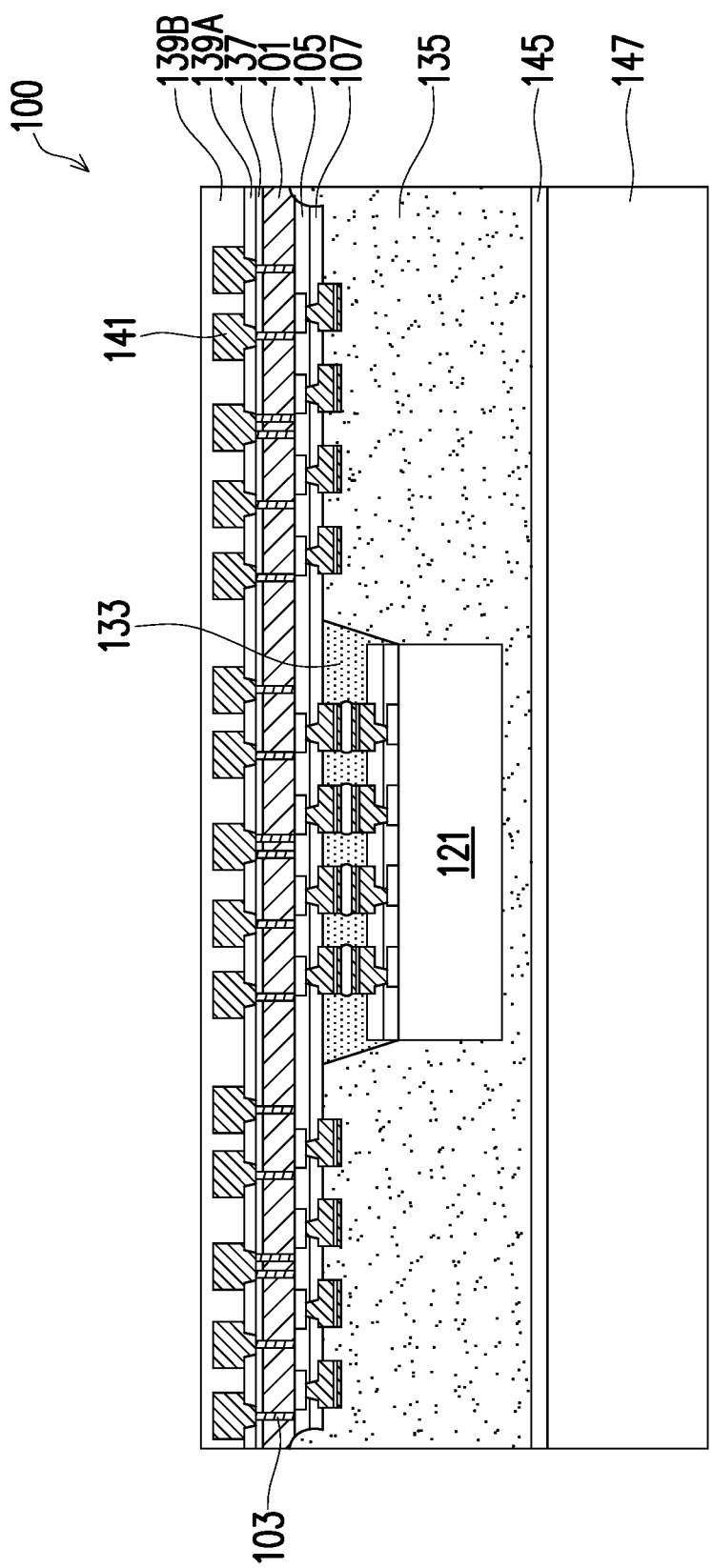

Next, in FIG. 4, the structure is FIG. 3 is flipped over, and is attached to a carrier 147 (e.g., a carrier with diameter of about 300 mm), e.g., through an adhesive layer 145. The carrier 147 may be made of a material such as glass, silicon, polymer, polymer composite, metal foil, ceramic, glass epoxy, beryllium oxide, tape, or other suitable material for structural support. The adhesive layer 145 is deposited or laminated over the carrier 147, in some embodiments. The adhesive layer 145 may be photosensitive and may be easily detached from the carrier 147 by shining, e.g., an ultra-violet (UV) light on the carrier 147 in a subsequent carrier de-bonding process. For example, the adhesive layer 145 may be a light-to-heat-conversion (LTHC) film.

Next, the wafer 101 is thinned by a wafer thinning process. The wafer thinning process may be an etching process (e.g., a dry etch process), a planarization process (e.g., CMP), combinations thereof, or the like. The wafer thinning process is performed from the backside of the wafer 101, and is performed until the through vias 103 are exposed. In an embodiment, the wafer thinning process is a dry etch process using an etchant selective to (e.g., having a higher etch rate for) the material (e.g., silicon) of the wafer 101, and after the wafer thinning process is finished, the through vias 103 protrude above the recessed backside of the wafer 101.

Next, a dielectric layer 137 is formed on the backside of the wafer 101. In an example embodiment, the dielectric layer 137 is a layer of silicon nitride formed by a CVD process. The through vias 103 may protrude above the as-deposited dielectric layer 137. Next, a planarization process, such as CMP, is performed to achieve a level upper surface between the through vias 103 and the dielectric layer 137.

Next, a passivation layer 139A is formed over the dielectric layer 137, and conductive bumps 141 are formed over the passivation layer 139A and electrically coupled to the through vias 103. The passivation layer 139A may be, e.g., a polymer layer such as polyimide, and is formed by a suitable formation method such as CVD or spin coating. The conductive bumps 141 may be, e.g., micro-bumps, copper pillars, or the like. After the conductive bumps 141 are formed, a passivation layer 139B is formed over the passivation layer 139A and the conductive bumps 141. In the example of FIG. 4, the passivation layer 139B encapsulates (e.g., covers top surfaces and sidewalls of) the conductive bumps 141 and protects the conductive bumps 141 in subsequent processing. The passivation layer 139B may be formed of a same or similar material as the passivation layer 139A, and therefore, in subsequently figures, the passivation layers 139A and 139B are shown as a passivation layer 139 for simplicity, with the understanding that the passivation layer 139 may include sublayers.

Figure 5:
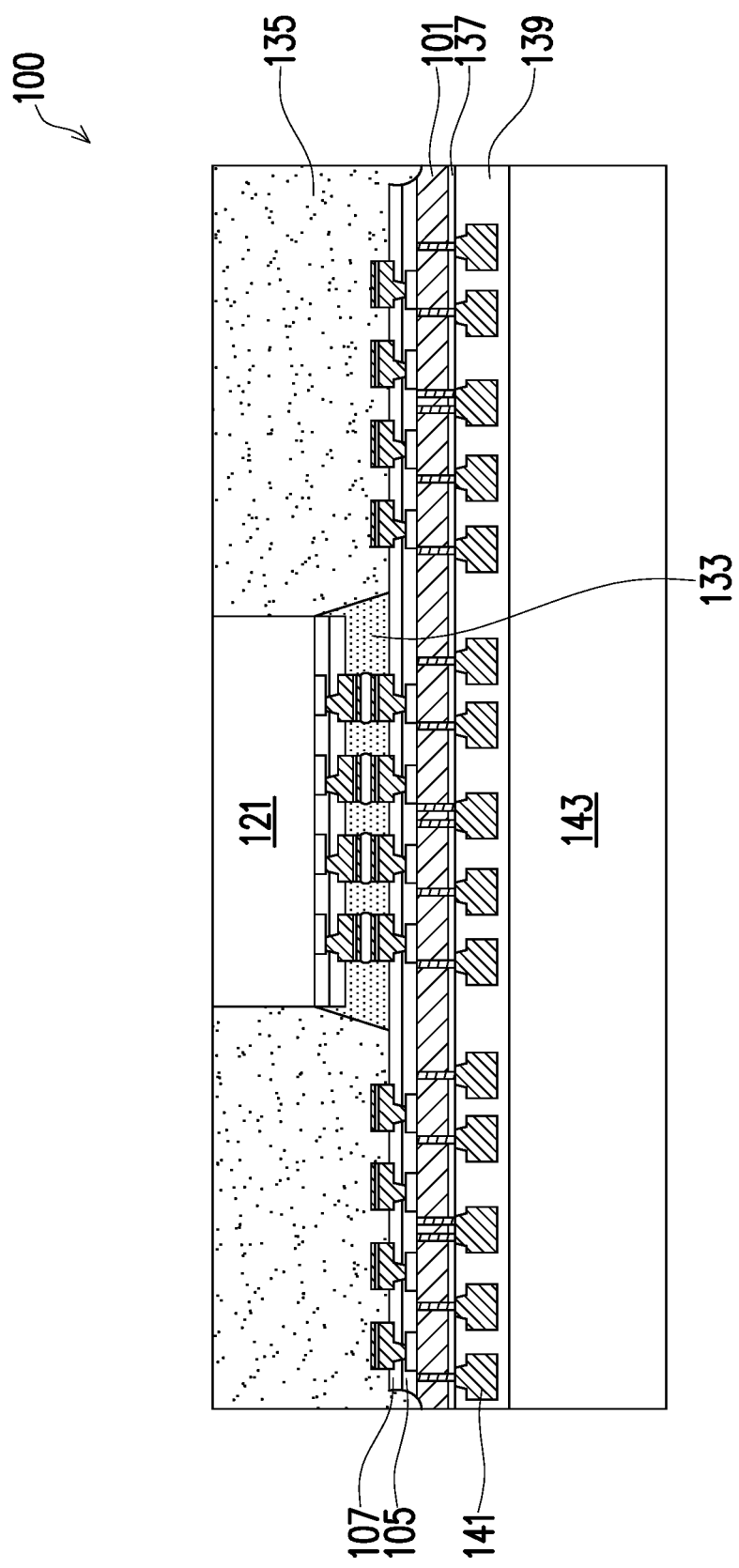

Next, in FIG. 5, the structure of FIG. 4 is flipped over, and is attached to a back-grinding (BG) tape 143. The BG tape 143 protects the conductive bumps 141 from damage during the subsequent planarization process.

Next, the carrier 147 is removed by a carrier de-bonding process. The carrier de-bonding process may remove the carrier 147 using any suitable process, such as etching, grinding, and mechanical peel off. In some embodiments, the carrier 147 is de-bonded by shining a laser or UV light over the surface of the carrier 147. The laser or UV light breaks the chemical bonds of the adhesive layer 145 that binds to the carrier 147, and the carrier 147 can then be easily detached. Next, an etching process, which is optional, may be performed to remove residual portions of the adhesive layer 145.

Next, a planarization process, such as CMP, is performed to recess the molding material 135 and to expose the backside of the die 121. After the planarization process is finished, the die 121 and the molding material 135 have a coplanar upper surface in FIG. 5.

Figure 6:
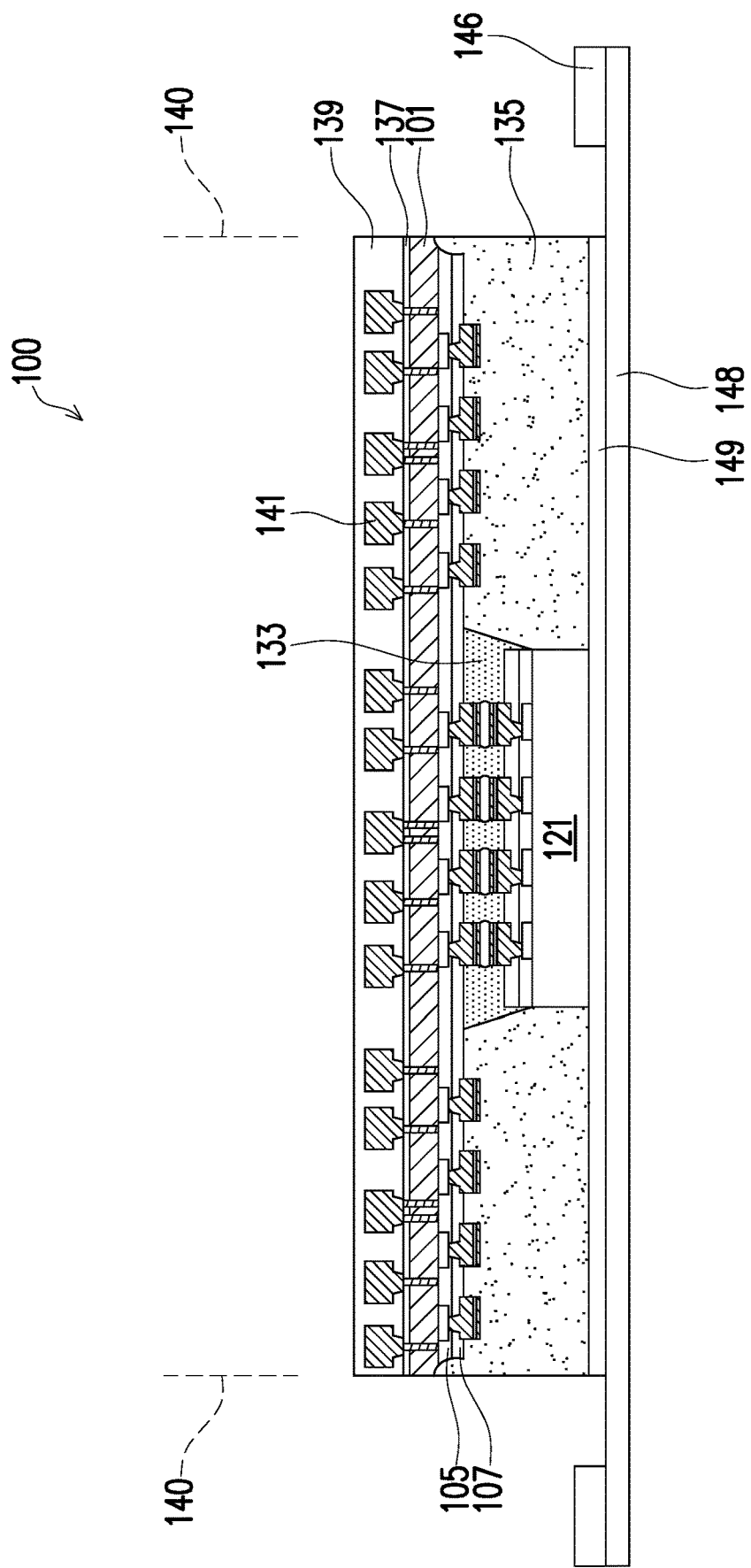

Next, in FIG. 6, a die attaching film (DAF) 149 is attached to the backside of the die 121 and the molding material 135, the structure of FIG. 5 is flipped over and attached to a tape 148 supported by a frame 146. The tape 148 may be a dicing tape for holding the semiconductor structure 100 in place in subsequent processing.

Next, a dicing process is performed, e.g., along lines 140 in FIG. 6, to separate the semiconductor structure 100 into a plurality of individual CoW packages. The lines 140 correspond to center regions of the grooves 115, or equivalently, center regions of the dicing regions of the wafer 101. Skilled artisans will readily appreciate that multiple CoW packages are formed by the processing steps in FIGS. 1-5, and the dicing process in FIG. 6 separates the multiple CoW packages into separate, individual CoW packages 100. Therefore, the structure shown in FIG. 6 corresponds to one of the CoW packages 100.

In some embodiments, the dicing process of FIG. 6 is performed using a blade. The blade cuts through the passivation layer 139, the dielectric layers 137, the wafer 101 and the molding material 135. The width of the blade is smaller than a width of the groove 115 such that during the dicing process, the blade does not contact (e.g., is spaced apart from) the dielectric layers 105/107. As a result, the dicing process exerts little or no stress on the dielectric layers 105/107 to prevent cracking of the dielectric layers 105/107. In some embodiments, the passivation layer 139 is formed of a soft material (e.g., polyimide), and the dielectric layer 137 is formed of a more durable material (e.g., silicon nitride), and therefore the dicing process using the blade does not cause cracking in these layers.

Figure 7:
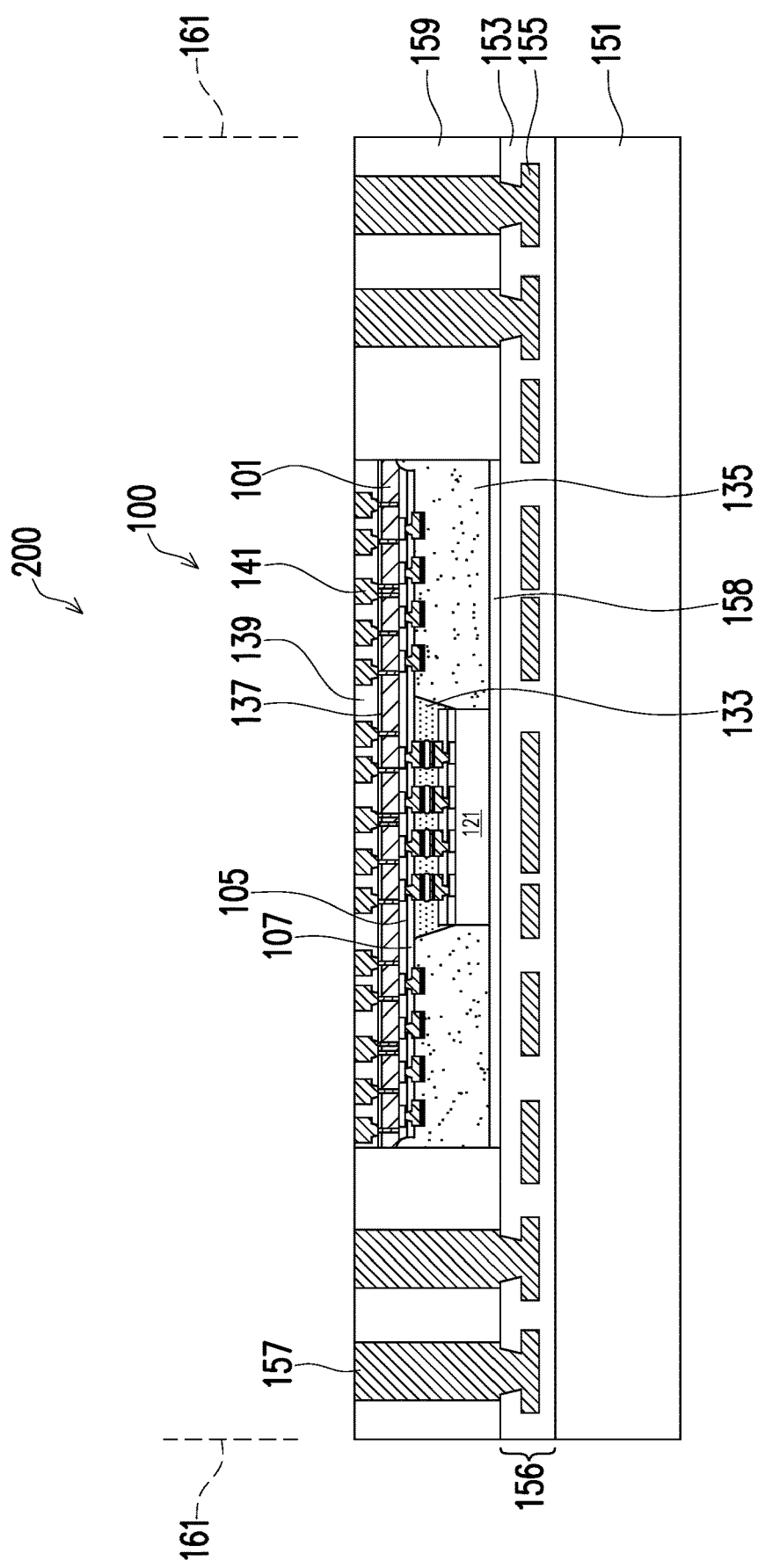
FIG. 7 illustrates a cross-sectional view of an Integrated Fan-Out (InFO) packages, in accordance with an embodiment.

FIG. 7 illustrates a cross-sectional view of an Integrated Fan-Out (InFO) packages 200 at a certain stage of fabrication, in an embodiment. The InFO package 200 is formed using the CoW package 100 of FIG. 6.

In FIG. 7, a redistribution structure 156 is formed on a carrier 151. The carrier 151 may have a diameter of, e.g., about 300 mm. The carrier 151 may be similar to the carrier 147 in FIG. 4, thus details are not repeated. The redistribution structure 156 includes one or more dielectric layers 153 and conductive features 155 (e.g., conductive lines, vias) formed in the one or more dielectric layers 153. The redistribution structure 156 may be formed by a formation method same as or similar to that of the redistribution structure 106 in FIG. 1, thus details are not repeated.

As illustrated in FIG. 7, conductive pillars 157 are formed over and electrically coupled to the redistribution structure 156. In some embodiments, to form the conductive pillars 157, openings are formed in a top dielectric layer 153 of the redistribution structure 156 to expose conductive features (e.g., conductive pads) of the redistribution structure 156. Next, a seed layer is formed over the top dielectric layer 153 and in the openings. Next, a pattern photoresist layer is formed over the seed layer, where openings of the patterned photoresist layer correspond to locations of the conductive pillars 157 to be formed. Next, an electrically conductive material (e.g., copper) is formed (e.g., through a plating process) in the openings of the patterned photoresist layer to fill the openings. Next, the patterned photoresist layer is removed, and an etching process is performed to remove portions of the seed layer over which no electrically conductive material is formed. Besides the above described method to form the conductive pillars 157, other methods are also possible and are fully intended to be included within the scope of the present disclosure.

In some embodiments, after the conductive pillars 157 are formed, individual CoW packages 100, such as those formed in FIG. 6, are attached to the redistribution structure 156, e.g., by an adhesive layer 158 (e.g., an LTHC film) adjacent to the conductive pillars 157. In an example embodiment, multiple CoW packages 100 are attached to the redistribution structure 156 in order to form multiple InFO packages simultaneously on the carrier 151. For simplicity, FIG. 7 only shows one of the InFO packages 200 on the carrier 151.

Next, a molding material 159 is formed over the redistribution structure 156 around the conductive pillars 157 and the CoW packages 100. In an example embodiment, the molding material 159 is formed of a different material from the molding material 135 in the CoW package 100. For example, the molding material 135 and the molding material 159 are chosen to ensure little or no wafer warpage for subsequent processing. Next, a planarization process, such as CMP, is performed to remove top portions of the molding material 159 to expose the conductive pillar 157 and the conductive bumps 141 of the CoW package 100. After the planarization, the molding material 159, the conductive pillars 157, and the conductive bumps 141 have a coplanar upper surface.

In some embodiments, a dicing process is performed next, e.g., by using a blade to cut along lines 161 in FIG. 7, which lines 161 correspond to the dicing regions of the carrier 151, to separate the InFO packages 200 formed on the carrier 151. Skilled artisans will readily appreciate that the InFO package 200 may be used as, e.g., a bottom package in a PoP package. Another semiconductor package, used as a top package, may be bonded to the conductive bumps 141 to form a PoP package. In some embodiments, the top packages are bonded to respective InFO packages 200 to form multiple PoP packages on the carrier 151, then the dicing process is performed along the lines 161 to separate the PoP packages from each other.

The grooves 115 formed during the formation process of the CoW package 100 help to reduce or prevent cracking of the dielectric layers 105/107 during the dicing process of FIG. 6. In addition, the grooves 115 further reduces stress of the dielectric layers 105/107 in the InFO package 200, thereby further reducing the likelihood of damage (e.g., cracking, or peeling) to the dielectric layers 105/107 in the InFO package 200. This is because the molding material 135 fills the grooves 115, and therefore, the dielectric layers 105/107 are surrounded by the molding material 135 and are separated from (e.g., not in contact with) the molding material 159. Without the grooves 115, sidewalls of the dielectric layers 105/107 would physically contact the molding material 159. Due to mismatch between the coefficients of thermal expansion (CTEs) of the molding materials 135/159 and the wafer 101, the molding material 159 would exert high stress on the dielectric layers 105/107, and may cause cracking or peeling of the dielectric layers 105/107 during, e.g., high temperature reliability test.

FIGS. 8A, 8B, 9, and 10 illustrate various views (e.g., cross-sectional view, top view) of a semiconductor structure 100A at various stages of fabrication, in accordance with another embodiment. The semiconductor structure 100A is similar to the semiconductor structure 100, but with additional grooves 116 formed in the wafer 101. Details are discussed below.

Figure 8A:
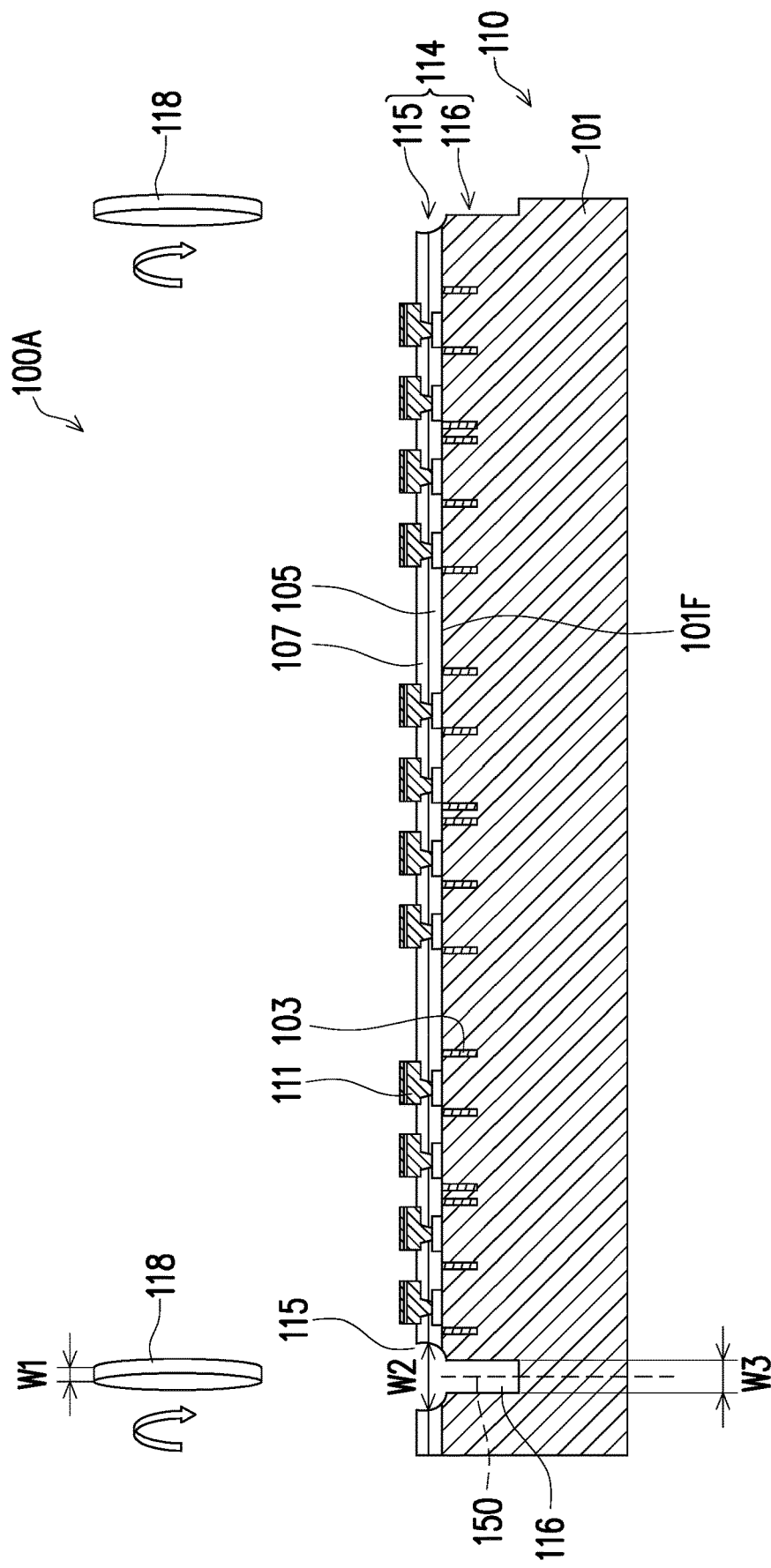
FIGS. 8A, 8B, 9, and 10 illustrate various views of a semiconductor structure at various stages of fabrication, in accordance with another embodiment.

The processing of FIG. 8A follows that of FIG. 2A. Recall that in FIG. 2A, grooves 115 are formed in the redistribution structure 106 using a laser tool to expose the wafer 101. To distinguish the grooves 115 in FIG. 2A from the additional grooves 116 formed in FIG. 8A, the grooves 115 are also referred to as first grooves 115, and the grooves 116 are referred to as second grooves 116. In addition, in the discussion of the semiconductor structure 100A, each of the first grooves 115 and a respective second grooves 116 are collectively referred to as a groove 114.

In FIG. 8A, after the first grooves 115 are formed in FIG. 2A by the laser etching process, second grooves 116 are formed to extend from the bottoms of the first grooves 115 into the wafer 101. Note that FIG. 2A only shows a portion of the wafer 101 (and its overlying layers) that corresponds to one of the CoW packages 100, and therefore, only half of each of the grooves 115 is shown. To facilitate discussion, FIG. 8A shows an adjacent portion (e.g., to the left of the line 150) of the wafer 101 (and its overlying layers), and therefore, shows a complete cross-sectional view of the first groove 115 and a complete cross-sectional view of the second groove 116 at the location of the line 150. The line 150 is along the center of the first groove 115 (or the center of the second groove 116).

In an example embodiment, the second grooves 116 are formed by cutting along the first grooves 115 using a blade 118. For example, the blade 118 is aligned with a center region of the first groove 115 (e.g., indicated by the line 150), and cuts from the bottom of the first groove 115 into the wafer 101 to form the second groove 116, which second groove 116 extends into, but not through, the wafer 101. The depth of the second groove 116 is larger than the height of the through via 103. In other words, the second groove 116 extends from the front side 101F of the wafer deeper into the wafer 101 than the through via 103. A width W1 of the blade 118 is chosen to be smaller than a width W2 of the first groove 115, such that during the cutting process, the blade 118 does not contact (e.g., is spaced apart from) the sidewalls of the dielectric layers 105/107. This avoids cracking of the dielectric layers 105/107 due to the stress induced by the cutting process. The width W3 of the second groove 116 is substantially the same as the width W1 of the blade 118 (e.g., W1=W3), in some embodiments. As illustrated in FIG. 8A, the width W2 of the first groove 115 is larger than the width W3 of the second groove 116. Therefore, in a top view, each second groove 116 is narrow than the respective first groove 115, and is disposed with the first groove 115. In the example of FIG. 8A, the first grooves 115 have curved sidewalls (e.g., due to laser etching), and the second grooves 116 have straight sidewalls (e.g., due to blade cutting). In some embodiments, using the blade 118 to form the second grooves 116 improves throughput of the manufacturing process, since it may be impractical or may take too long to form deep grooves (e.g., 116) using laser.

Figure 8B:
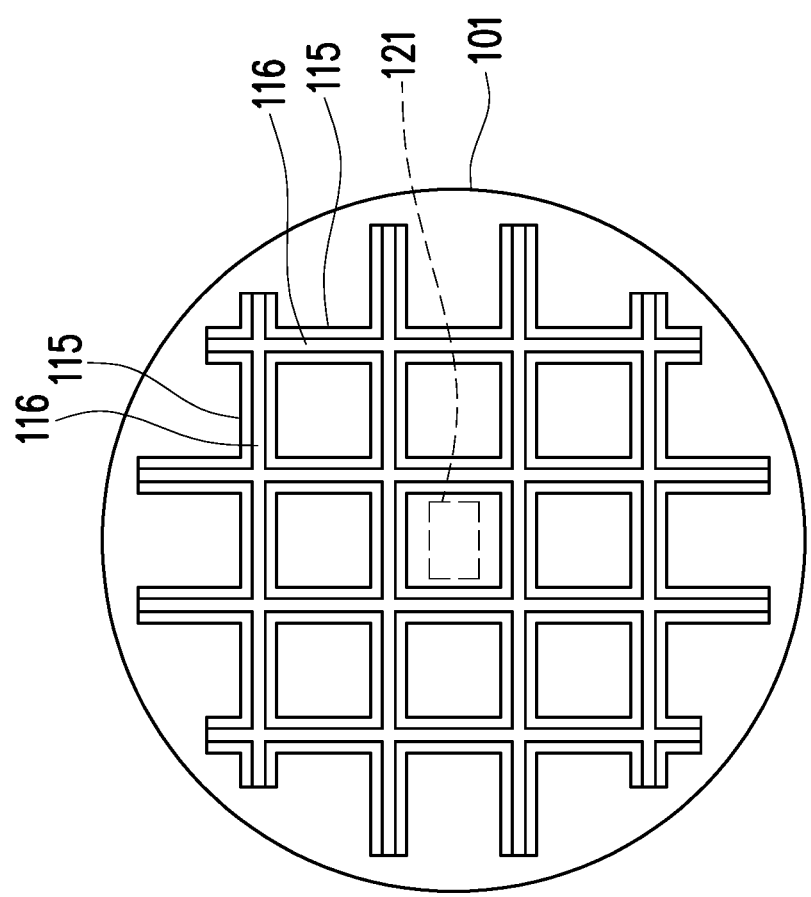

FIG. 8B illustrates a top view of the structure shown in FIG. 8A. For simplicity, not all features of FIG. 8A are illustrated in FIG. 8B. FIG. 8B shows the wafer 101, and the first grooves 115 extending along the dicing regions of the wafer 101. FIG. 8B also illustrates the second grooves 116, which also extend along the dicing regions and are disposed within the boundaries of the respective first grooves 115. For example, each second groove 116 is center with respect to the respective first groove 115. FIG. 8B further illustrates a die 121 (shown in phantom) attached to one of the die attaching regions. The die 121 in FIG. 8B may correspond to the die 121 in FIG. 9.

Figure 9:
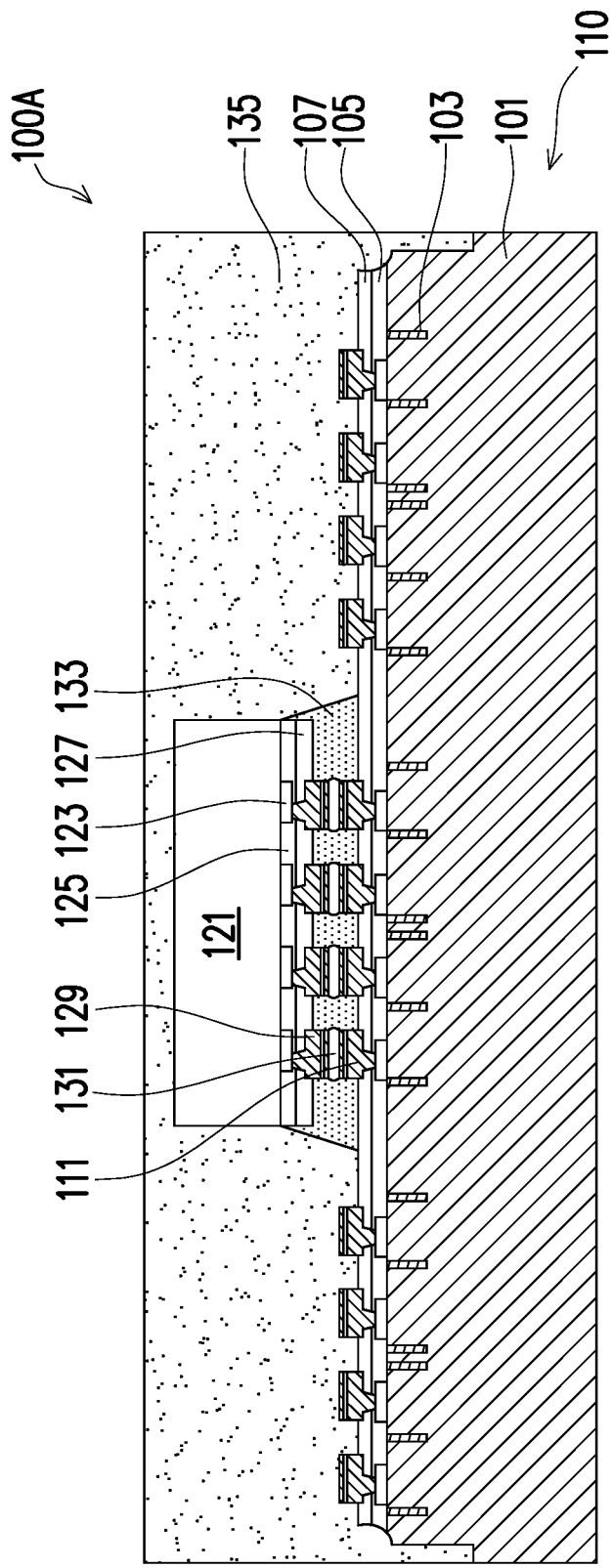

Next, in FIG. 9, the die 121 is bonded to external connectors in of the interposer no. The underfill material 133 is formed between the die 121 and the interposer no. The molding material 135 is formed over the interposer no around the die 121. Notably, the molding material 135 fills the first grooves 115 and the second grooves 116. The processing is similar to that of FIG. 3, thus details are not repeated.

Next, the structure of FIG. 9 is processed by the same processing shown in FIG. 4 to thin the wafer 101, and to form the dielectric layer 137, the conductive bumps 141, and the passivation layers 139A/139B at the backside of the wafer 101. Next, following the same processing in FIG. 5, the structure is flipped over and attached to the BG tape 143, and a planarization process, such as CMP, is performed to recess the molding material 135 and to expose the backside of the die 121.

Figure 10:
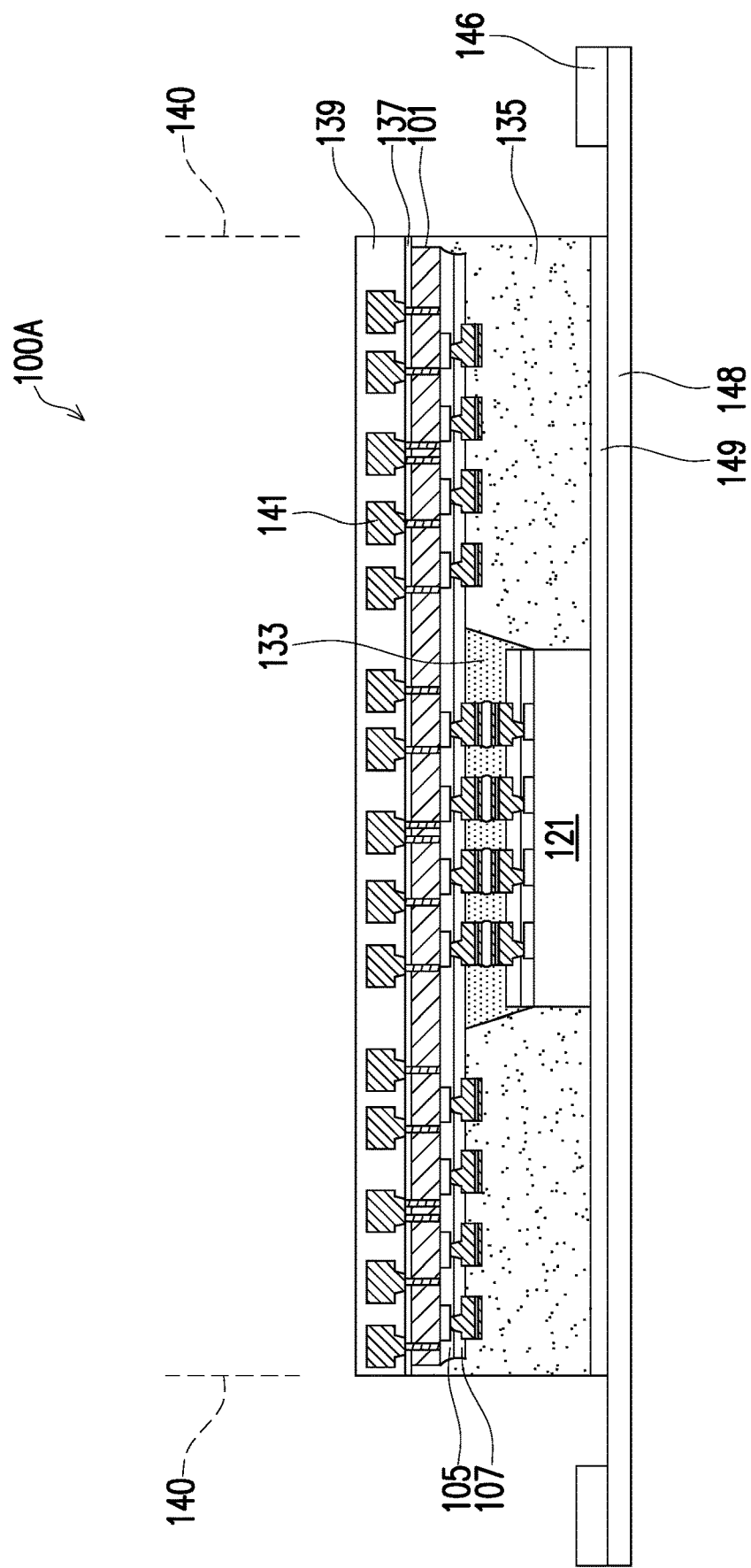

Next, as illustrated in FIG. 10, the die attaching film (DAF) 149 is attached to the backside of the die 121 and the molding material 135, the semiconductor structure 100A is attached to the tape 148 supported by the frame 146. The tape 148 may be a dicing tape for holding the semiconductor structure 100A in place in subsequent processing.

Next, a dicing process is performed, e.g., along lines 140 in FIG. 10, to separate the semiconductor structure 100A into a plurality of individual CoW packages 100A. The lines 140 correspond to center regions of the grooves 115, or equivalently, center regions of the dicing regions of the wafer 101.

In some embodiments, the dicing process of FIG. 10 is performed using a blade. The blade cuts through the passivation layer 139, the dielectric layers 137, and the molding material 135. Note that due to the second grooves 116 and the thinning of the wafer 101, the molding material 135 surrounds the wafer 101 (e.g., the portion of the wafer in each CoW package 100A) and the dielectric layers 105/107. In other words, the sidewalls of the wafer 101 and the sidewalls of the dielectric layers 105/107 are recessed from respective sidewalls of the passivation layer 139 (or the sidewalls of the dielectric layer 137), and are covered by the molding material 135. Therefore, the portion of the molding material 135 in the second grooves 116 contacts (e.g., physically contact) and extends along the lower surface of the dielectric layer 137.

As discussed above, due to the formation of the second grooves 116, the sidewalls of the wafer 101 and the sidewalls of the dielectric layers 105/107 are recessed from respective sidewalls of the passivation layer 139 (or the sidewalls of the dielectric layer 137). Therefore, the width of the blade in the dicing processing of FIG. 10 may be chosen to be small, such that the blade does not contact the wafer 101 or the dielectric layers 105/107, this reduces or avoids cracking of the wafer 101, as well as the cracking of the dielectric layers 105/107, during the dicing process. For example, the width W4 of the blade using in the dicing process of FIG. 10 may be chosen to be smaller than the width W3 of the second groove 116 (see FIG. 8A) such that during the dicing process of FIG. 10, the blade does not contact (e.g., is spaced apart from) the wafer 101 or the dielectric layers 105/107. In addition, under this configuration, the subsequently formed molding material 159 (see FIG. 11) would not contact the sidewalls of the wafer 101, which further reduces the stress aggregation on the wafer body and mitigates the risk of peeling and crack of the dielectric layers 105/107. In some embodiments, the width W4 of the blade may be chosen to be between the width W3 and the width W2 (e.g., W3≤W4<W2), such that during the dicing process of FIG. 10, the blade contacts the wafer 101 but does not contact the dielectric layers 105/107.

Figure 11:
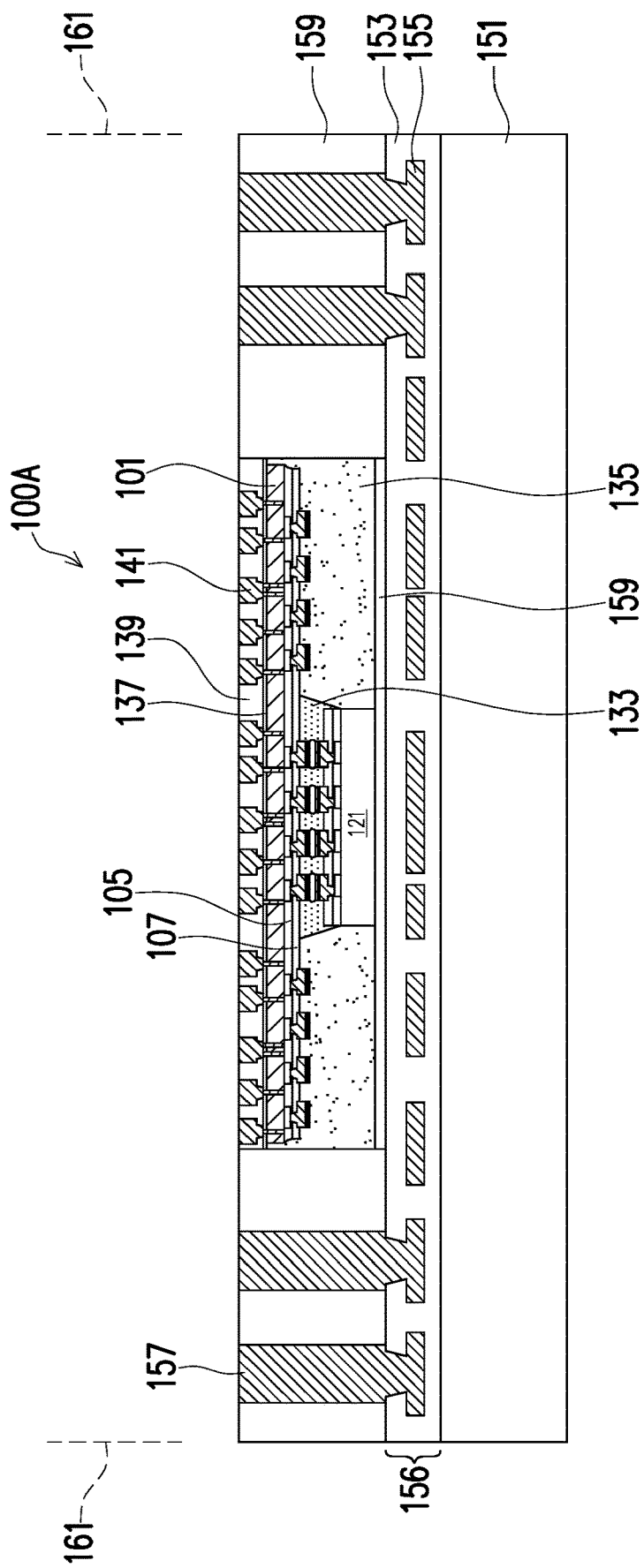
FIG. 11 illustrates a cross-sectional view of an Integrated Fan-Out (InFO) packages, in accordance with another embodiment.

FIG. 11 illustrates a cross-sectional view of an Integrated Fan-Out (InFO) packages 200A, in another embodiment. The InFO package 200A is formed using the CoW package 100A of FIG. 10. The processing is the same as that of FIG. 7, thus details are not repeated.

Figure 12:
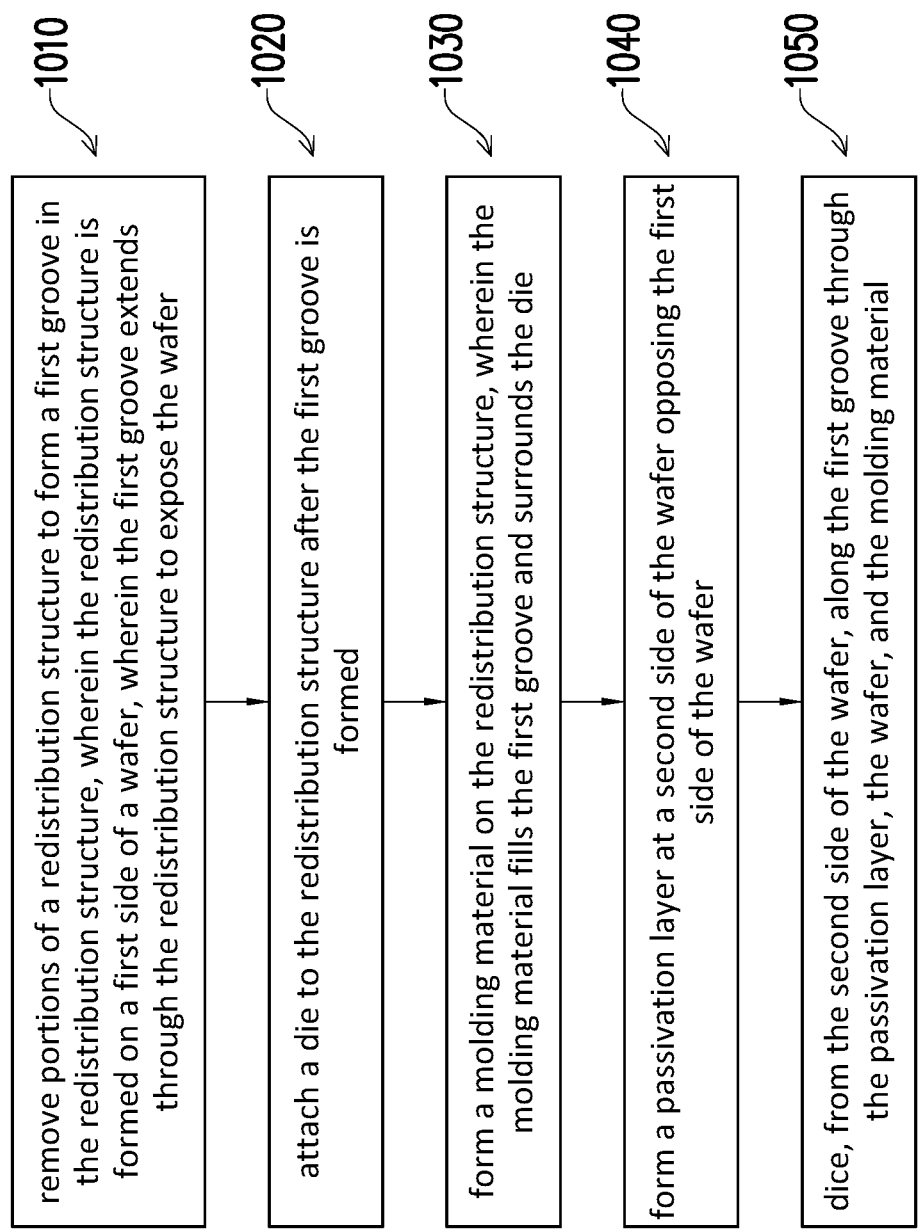
FIG. 12 illustrates a flow chart of a method for forming semiconductor structure, in accordance with some embodiments.

FIG. 12 illustrates a flow chart of a method 1000 for fabricating a semiconductor structure, in accordance with some embodiments. It should be understood that the embodiment method shown in FIG. 12 is merely an example of many possible embodiment methods. One of ordinary skill in the art would recognize many variations, alternatives, and modifications. For example, various steps as illustrated in FIG. 12 may be added, removed, replaced, rearranged and repeated.

As illustrated in FIG. 12, at block 1010, portions of a redistribution structure are removed to form a first groove in the redistribution structure, wherein the redistribution structure is formed on a first side of a wafer, wherein the first groove extends through the redistribution structure to expose the wafer. At block 1020, a die is attached to the redistribution structure after the first groove is formed. At block 1030, a molding material is formed on the redistribution structure, wherein the molding material fills the first groove and surrounds the die. At block 1040, a passivation layer is formed at a second side of the wafer opposing the first side of the wafer. At block 1050, a dicing process is performed from the second side of the wafer, along the first groove through the passivation layer, the wafer, and the molding material.

Advantageous features of some embodiments described herein may include reduced likelihood of damage (e.g., cracking or peeling) of the dielectric layers 105/107. For example, the first grooves 115 allows the blade used in the dicing process to cut without contacting the dielectric layers 105/107. The second grooves 116 allows the blade used in the dicing process to cut without contacting the wafer 101 or the dielectric layers 105/107. As a result of the grooves (e.g., 115, and/or 116) formed, sidewalls of the dielectric layers 105/107 are covered by the molding material 135 and is spaced apart from the molding material 159, which further reduces the stress exerted on the dielectric layers 105/107 in the InFO package formed. Therefore, the reliability of the device formed and production yield are improved.

In accordance with an embodiment, a method of forming a semiconductor structure includes: forming a first redistribution structure on a first side of a wafer, the first redistribution structure comprising dielectric layers and conductive features in the dielectric layers; forming grooves in the first redistribution structure, the grooves exposing sidewalls of the dielectric layers and the wafer, the grooves defining a plurality of die attaching regions; bonding a plurality of dies to the first redistribution structure in the plurality of die attaching regions; forming a first molding material on the first side of the wafer around the plurality of dies, the first molding material filling the grooves; forming a passivation layer on a second side of the wafer opposing the first side; and dicing along the grooves from the second side of the wafer to form a plurality of individual semiconductor packages, each of the plurality of individual semiconductor packages comprising a respective die. In an embodiment, the grooves are formed along dicing regions of the wafer. In an embodiment, forming the grooves comprises forming first grooves by removing portions of the dielectric layers disposed along the dicing regions using a laser tool. In an embodiment, the first grooves extend through the first redistribution structure and expose the wafer at bottoms of the first grooves. In an embodiment, forming the grooves further comprises, after forming the first grooves using the laser tool, forming second grooves that extend from bottoms of the first grooves into the wafer. In an embodiment, forming the second grooves comprises cutting into the wafer from the bottoms of the first grooves using a blade. In an embodiment, a width of the blade is smaller than a width of the first grooves such that the blade is spaced apart from the first redistribution structure during the cutting. In an embodiment, the second grooves are formed to extend into, but not through, the wafer. In an embodiment, the first grooves are wider than the second grooves. In an embodiment, the method further comprises, after the dicing: attaching a semiconductor packages of the plurality of individual semiconductor packages to a first side of a second redistribution structure, wherein the second redistribution structure is formed on a carrier; forming conductive pillars on the first side of the second redistribution structure adjacent to the semiconductor package; and forming a second molding material on the first side of the second redistribution structure around the semiconductor packages.

In accordance with an embodiment, a method of forming a semiconductor structure includes: removing portions of a redistribution structure to form a first groove in the redistribution structure, wherein the redistribution structure is formed on a first side of a wafer, wherein the first groove extends through the redistribution structure to expose the wafer; attaching a die to the redistribution structure after the first groove is formed; forming a molding material on the redistribution structure, wherein the molding material fills the first groove and surrounds the die; forming a passivation layer at a second side of the wafer opposing the first side of the wafer; and dicing, from the second side of the wafer, along the first groove through the passivation layer, the wafer, and the molding material. In an embodiment, the dicing comprises dicing along the first groove using a blade. In an embodiment, during the dicing, the blade does not contact the redistribution structure. In an embodiment, the method further comprises, after the first groove is formed and before attaching the die, forming a second groove that extends from a bottom of the first groove into the wafer, wherein in a top view, the second groove overlaps with the first groove. In an embodiment, the first groove is formed using a laser tool, wherein the second groove is formed by cutting into the wafer using a blade. In an embodiment, during the cutting, the blade is aligned with a center of the first groove and is spaced apart from the redistribution structure.

In accordance with an embodiment, a semiconductor structure includes: a wafer; a first redistribution structure at a first side of the wafer, wherein sidewalls of the first redistribution structure are recessed from respective sidewalls of the wafer; a die attached to the first redistribution structure, wherein the first redistribution structure is between the wafer and the die; and a first molding material around the die and around the first redistribution structure, wherein the first molding material extends along sidewalls of the first redistribution structure and sidewalls of the die. In an embodiment, the semiconductor structure further comprises a passivation layer at a second side of the wafer opposing the first side of the wafer, wherein sidewalls of the first molding material are aligned along same lines with respective sidewalls of the passivation layer. In an embodiment, the first molding material further extends along sidewalls of the wafer. In an embodiment, the semiconductor structure further comprises: a second redistribution structure, wherein the die and the first molding material are attached to a first side of the second redistribution structure, wherein the first molding material is between the second redistribution structure and the first redistribution structure; a second molding material along the first side of the second redistribution structure, wherein the second molding material surrounds the first molding material, the wafer, and the passivation layer; and a conductive pillar in the second molding material and laterally adjacent to the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
    forming a first redistribution structure on a first side of a wafer, the first redistribution structure comprising dielectric layers and conductive features in the dielectric layers;
    forming grooves in the first redistribution structure, the grooves exposing sidewalls of the dielectric layers and the wafer, the grooves defining a plurality of die attaching regions;
    bonding a plurality of dies to the first redistribution structure in the plurality of die attaching regions;
    forming a first molding material on the first side of the wafer around the plurality of dies, the first molding material filling the grooves;
    forming a passivation layer on a second side of the wafer opposing the first side;
    dicing along the grooves from the second side of the wafer to form a plurality of individual semiconductor packages, each of the plurality of individual semiconductor packages comprising a respective die and a respective portion of the wafer;
    after the dicing, attaching a semiconductor package of the plurality of individual semiconductor packages to a first side of a second redistribution structure, wherein the second redistribution structure is formed on a carrier;
    forming conductive pillars on the first side of the second redistribution structure adjacent to the semiconductor package; and
    forming a second molding material on the first side of the second redistribution structure around the semiconductor package.

2. The method of claim 1, wherein the grooves are formed along dicing regions of the wafer.

3. The method of claim 2, wherein forming the grooves comprises forming first grooves by removing portions of the dielectric layers disposed along the dicing regions using a laser tool.

4. The method of claim 3, wherein the first grooves extend through the first redistribution structure and expose the wafer at bottoms of the first grooves.

5. The method of claim 3, wherein forming the grooves further comprises, after forming the first grooves using the laser tool, forming second grooves that extend from bottoms of the first grooves into the wafer, wherein the first grooves are wider than the second grooves.

6. The method of claim 5, wherein forming the second grooves comprises cutting into the wafer from the bottoms of the first grooves using a first blade, wherein the second grooves are formed to extend into, but not through, the wafer, wherein a first width of the first blade is smaller than a width of the first grooves such that the first blade is spaced apart from the first redistribution structure during the cutting.

7. The method of claim 6, wherein the dicing comprises dicing along the grooves from the second side of the wafer using a second blade, wherein a second width of the second blade is smaller than the first width of the first blade, wherein the second blade is spaced apart from the first redistribution structure during the dicing.

8. The method of claim 7, further comprising, after forming the first molding material and before forming the passivation layer, thinning the wafer from the second side of the wafer, wherein after thinning the wafer, the first molding material in the second grooves is exposed at the second side of the wafer.

9. The method of claim 8, wherein during the dicing, the second blade cuts through the passivation layer and the first molding material without contacting the wafer and the first redistribution structure.

10. A method of forming a semiconductor structure, the method comprising:
    removing portions of a redistribution structure to form a first groove in the redistribution structure, wherein the redistribution structure is formed on a first side of a wafer, wherein the first groove extends through the redistribution structure to expose the wafer;
    after removing the portions of the redistribution structure, forming a second groove that extends from a bottom of the first groove into the wafer by cutting into the wafer using a first blade, wherein a width of the second groove is smaller than that of the first groove;
    attaching a die to the redistribution structure after the second groove is formed;
    forming a molding material on the redistribution structure, wherein the molding material fills the first groove and the second groove and surrounds the die;
    forming a passivation layer at a second side of the wafer opposing the first side of the wafer; and
    dicing, from the second side of the wafer, along the second groove through the passivation layer, the wafer, and the molding material, wherein the dicing comprises dicing from the second side of the wafer using a second blade, wherein a width of the second blade is smaller than that of the first blade, wherein during the dicing, the second blade is aligned with a center of the second groove and is spaced apart from the redistribution structure.

11. The method of claim 10, wherein in a top view, the second groove overlaps with the first groove.

12. The method of claim 11, wherein the first groove is formed using a laser tool, wherein during the cutting, the first blade is aligned with a center of the first groove and is spaced apart from the redistribution structure.

13. The method of claim 10, wherein after the dicing, a semiconductor package is formed that comprises the die, the redistribution structure, and a portion of the wafer attached to the die, wherein the method further comprises, after the dicing:
    attaching the semiconductor package to a first side of a second redistribution structure, wherein the second redistribution structure is formed on a carrier;
    forming a conductive pillar on the first side of the second redistribution structure adjacent to the semiconductor package; and
    forming another molding material on the first side of the second redistribution structure around the semiconductor package and the conductive pillar.

14. A method of forming a semiconductor structure, the method comprising:
    forming first grooves in a redistribution structure by removing portions of the redistribution structure using a laser tool, wherein the redistribution structure is formed on a first side of a wafer, wherein the first grooves are formed to extend through the redistribution structure and expose the wafer;
    forming second grooves that extend from bottoms of the first grooves into the wafer by cutting into the wafer from the bottoms of the first grooves using a first blade;
    attaching a die to the redistribution structure after the first grooves and the second grooves are formed;
    forming a molding material on the redistribution structure around the die, wherein the molding material fills the first grooves and the second grooves; and
    dicing the wafer from a second opposing side of the wafer along the second grooves, wherein the dicing comprises cutting through the wafer and the molding material using a second blade, wherein a width of the second blade is smaller than a width of the first blade.

15. The method of claim 14, wherein during the dicing, the second blade does not contact the redistribution structure.

16. The method of claim 15, wherein a width of the first blade is smaller than a width of the first grooves, wherein the first blade is spaced apart from the redistribution structure during the cutting.

17. The method of claim 14, further comprising, after forming the molding material and before dicing the wafer, thinning the wafer from the second opposing side of the wafer, wherein after thinning the wafer, the molding material in the second grooves is exposed at the second opposing side of the wafer.

18. The method of claim 17, wherein during the dicing, the second blade does not contact the wafer.

19. The method of claim 14, further comprising, after forming the molding material and before dicing the wafer, forming a passivation layer on the second opposing side of the wafer, wherein the dicing comprises cutting through the passivation layer using the second blade.

20. The method of claim 14, wherein after the dicing, a semiconductor package is formed that comprises the die, the redistribution structure, and a portion of the wafer attached to the die, wherein the method further comprises, after the dicing:
    attaching the semiconductor package to a second redistribution structure, wherein the second redistribution structure is formed on a carrier;
    forming conductive pillars on the second redistribution structure adjacent to the semiconductor package; and
    forming another molding material on the second redistribution structure around the semiconductor package.

* * * * *